United States Patent
Shono et al.

(10) Patent No.: US 6,842,471 B2
(45) Date of Patent: Jan. 11, 2005

(54) SEMICONDUCTOR LASER DEVICE HAVING A CURRENT NON-INJECTION AREA

(75) Inventors: Atsushi Shono, Tokyo (JP); Hitoshi Hotta, Tokyo (JP); Hiroyuki Sawano, Tokyo (JP)

(73) Assignee: NEC Compound Semiconductor Devices, Ltd., Kawasaki (JP)

( * ) Notice: Subject to any disclaimer, the term of this patent is extended or adjusted under 35 U.S.C. 154(b) by 0 days.

(21) Appl. No.: 10/402,926

(22) Filed: Apr. 1, 2003

(65) Prior Publication Data

US 2004/0022288 A1 Feb. 5, 2004

(30) Foreign Application Priority Data

Apr. 2, 2002 (JP) ........................................ 2002-100128

(51) Int. Cl.[7] ............................................... H01S 5/00
(52) U.S. Cl. ........................................... 372/46; 372/45
(58) Field of Search ..................................... 372/43–50

(56) References Cited

U.S. PATENT DOCUMENTS 6,647,043 B2 * 11/2003 Arakida et al. ............... 372/46

FOREIGN PATENT DOCUMENTS

| JP | 62-051281 | 3/1987 | |
|----|-----------|--------|---|
| JP | 2-239679 | 9/1990 | |
| JP | 4-218993 | 8/1992 | |
| JP | 2001-196693 | 7/2001 | |
| JP | 2001-332811 | 11/2001 | |
| JP | 2001332811 | * 11/2001 | ............. H01S/5/00 |

* cited by examiner

*Primary Examiner*—Quyen Leung
(74) *Attorney, Agent, or Firm*—McGinn & Gibb, PLLC

(57) ABSTRACT

A semiconductor laser device includes an active layer and first and second current blocking layers having aligned stripe openings for injecting operating current into the active layer in a current injection area. The second current blocking layer has another opening, through which the first current blocking layer contacts an external cladding layer, in the vicinity of the emission facet of the laser cavity to form a current non-injection area. The first current blocking layer and the external cladding layer have a substantially equal refractive index.

23 Claims, 7 Drawing Sheets

SEMICONDUCTOR LASER DEVICE HAVING A CURRENT NON-INJECTION AREA

BACKGROUND OF THE INVENTION (a) Field of the Invention

The present invention relates to a semiconductor laser device having a current non-injection area and, more particularly, to a semiconductor laser device suitably used for recording data on a recording medium such as an optical disk and a magneto-optical disk.

(b) Description of the Related Art

Red-ray semiconductor laser devices having higher output powers, such as an AlGaInP-group semiconductor laser device, are generally used for recording data on a recording medium, such as a DVD (digital versatile disk) or a magneto-optical disk. JP-A-4-218993 describes a self-aligned-structure (SAS) semiconductor laser device as a high-output-power laser device.

Referring to FIG. 19, the semiconductor laser device includes an n-type GaAs substrate (referred to as n-GaAs substrate hereinafter) 101, and a layer structure including a buffer layer 102, n-type lower cladding layers 103 and 104, an active layer 105 and a p-type upper cladding layer 106, a current blocking layer 121, a cap layer 109, an external cladding layer 110 and a p-side electrode 111, which are consecutively formed on the n-GaAs substrate 101. The current blocking layer 109 and the cap layer 109 have a stripe opening, through which the external cladding layer 110 contacts the p-type cladding layer 106.

It is known that this type of the semiconductor laser device has improved characteristics such as a lower threshold current and a higher lasing efficiency by using AlInP or AlGaInP in the cladding layers (or optical confinement layers). This is because AlInP and AlGaInP scarcely absorb laser.

However, there is a problem in the semiconductor laser device having such a higher output power that it is susceptible to a catastrophic optical damage (COD) in a higher output power range of the laser device to have a defect on the facet of the laser cavity.

JP-A-02-239679 describes a semiconductor laser device which is capable of preventing the COD by providing a current blocking layer, which prevents current injection in the vicinity of the facet. However, there arises another problem in that this type of the laser device does not effectively confine the laser in the lateral direction in the vicinity of the facet, thereby causing an unstable lateral mode.

JP-A-2001-196693 describes a SAS semiconductor laser device which is capable of solving the above problems and preventing the COD by diordering the vicinity of the emission facet of the laser cavity to thereby suppress the laser absorption at the emission facet. However, there arises another problem in that this type of the laser device has a larger leakage current in the vicinity of the facet to thereby degrade the laser characteristics as to the threshold current and the slope efficiency.

JP-A-2001-332811 describes a semiconductor laser device which is capable of solving the above problems by controlling the thickness of the current blocking layer in the vicinity of the cavity facet, thereby providing a current non-injection area in the vicinity of the cavity facet. This structure achieves suppression of the COD, and allows the lateral mode and the radiation angle of the laser device to be effectively controlled. However, it is generally difficult to control the thickness of the current blocking layer within the area thereof. In addition, there is a problem in that the difference in the profile of the refractive index between the current injection area and the current non-injection area raises the mode dispersion loss of the laser device.

JP-A-62-51281 describes a semiconductor laser device which is capable of suppressing the COD by using two current blocking layers, wherein the two current blocking layers have aligned openings to form a current injection area and the lower current blocking layer has no opening in the vicinity of the facet to form a current non-injection area in the vicinity. This structure is free from the problem of the difficulty in the thickness control of the current blocking layer. However, there remains the problem of the difference in the profile of the refractive index between the current injection area and the current non-injection area, causing the increase of the mode dispersion loss.

SUMMARY OF THE INVENTION

In view of the above, it is an object of the present invention to provide a semiconductor laser device which is capable of suppressing the COD at the cavity facet, including a current blocking layer having a well controllable thickness, and suppressing the mode dispersion loss.

The present invention provides a semiconductor laser device having: a semiconductor substrate; and a layer structure formed thereon and including, consecutively as viewed from the bottom, a lower cladding layer, an active layer, an upper cladding layer, first and current blocking layers, and an external cladding layer, the layer structure configuring a laser cavity having an emission facet and a rear facet, the first and second cladding layers having compositions different from each other, the first and second cladding layers having aligned first openings to form a current injection area for injecting operating current into the active layer, the second current blocking layer having a second opening, through which the external cladding layer contacts the first current blocking layer, in a vicinity of the emission facet to form a current non-injection area for blocking the operating current, the external cladding layer having a refractive index substantially equal to a refractive index of the first current blocking layer.

In accordance with the semiconductor laser device of the present invention, the first and second current blocking layers in combination form the current injection area and the current non-injection area. The difference in the composition between the first current blocking layer and the second current blocking layer allows an effective selective etching to be performed therebetween, and the substantial equality of the refractive indexes of the first current blocking layer and the external cladding layer allows the profile of the refractive index to be uniform between the current injection area and the current non-injection area, thereby suppressing the mode dispersion loss of the laser device.

The above and other objects, features and advantages of the present invention will be more apparent from the following description, referring to the accompanying drawings.

PREFERRED EMBODIMENTS OF THE INVENTION

Figure 1:
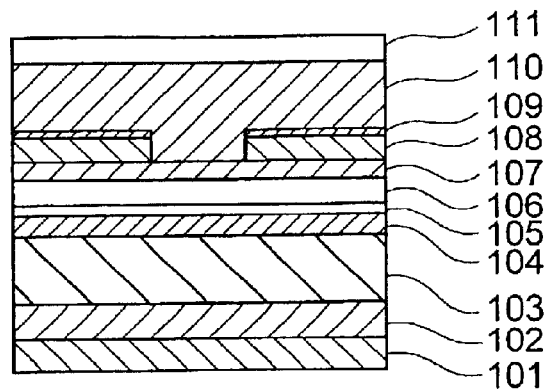
FIG. 1 is a sectional view of a semiconductor laser according to an embodiment of the present invention at a fabrication step thereof.

Now, the present invention is more specifically described with reference to accompanying drawings, wherein similar constituent elements are designated by similar reference numerals throughout the drawings.

Referring to FIG. 1, a semiconductor laser device according to an embodiment of the present invention includes a GaAs substrate 101 and a layer structure including a buffer layer 102, lower cladding layers 103 and 104, an active layer structure 105, an upper cladding layer 106, a first current blocking layer 107, a second current blocking layer 108, an internal cap layer 109, an external cladding layer 110 and an external cap layer 111, which are consecutively formed on the GaAs substrate 101. It is to be noted that n-side electrode and p-side electrode are omitted therein for depiction.

In the semiconductor laser device of the present embodiment, the first current blocking layer 107 does not have an opening in the vicinity of the emission facet of the laser device, where the second current blocking layer 108 has an opening, as shown in FIG. 1. The first current blocking layer 107 blocks injection of current into the active layer structure 105 in the vicinity of the emission facet of the laser device, thereby suppressing the COD at the emission facet. However, the first and second current blocking layers 107 and 108 have overlapping (or aligned) openings in the stripe current injection area, which is not shown in FIG. 1.

In general, the semiconductor laser device should have a current blocking layer which absorbs a less amount of laser in the current injection area for reducing the mode dispersion loss. For this purpose, the semiconductor laser device of the present embodiment includes an $Al_xGa_{1-x}InP$ layer or $Al_yGa_{1-y}As$ layer as the current blocking layers. The Al content of the $Al_xGa_{1-x}InP$ layer or $Al_yGa_{1-y}As$ layer is selected so that the current blocking layers scarcely absorb laser at the emission wavelength. In addition, the topmost n-GaAs cap layer 109 has a specified thickness so as to absorb less amount of laser.

For controlling the lateral mode at the emission facet of the laser cavity, the refractive index should have a difference ($\Delta n$) between the external and the internal of the stripe. Thus, the laser device of the present embodiment has two current blocking layers 107 and 108 for achieving the difference by selecting the width of the stripe opening of the second current blocking layer 108 and the thickness of the first current blocking layer 107. By selecting the Al content of the first current blocking layer 107 lower than the Al content of the second current blocking layer 108, a desired selective etching can be obtained. This provides an excellent controllability of the thickness of the first current blocking layer 107.

By employing the configuration as described above, both a lower operational loss and an excellent controllability of the lateral mode in the current non-injection area can be obtained. In addition, by selecting the refractive index of the n-AlGaInP first current blocking layer substantially equal to the refractive index of the p-AlGaAs embedding (external) cladding layer, the refractive index profile is substantially uniform between the current injection area and the current non-injection area at the depth of the first current blocking layer 107. This suppresses the mode dispersion loss.

Moreover, the active layer structure 105 has a mixed-crystal structure by diffusing Zn from the internal cladding layer 106 in the vicinity of the emission facet before depositing the first and second current blocking layers 107 and 108. This suppresses optical absorption in the vicinity of the emission facet, whereby the COD at the facet can be suppressed in the case of lasing at a higher output power range.

A plurality of examples implementing the semiconductor laser device of the embodiment will be described below with reference to the fabrication process thereof.

FIRST EXAMPLE

Figure 2:
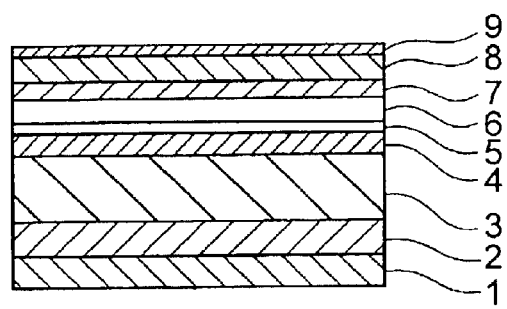
FIG. 2 is a sectional view of the vicinity of the emission facet of a first example according to the embodiment of the semiconductor laser device at a fabrication step in a manufacturing process thereof.

Referring to FIG. 2, there is shown an initial fabrication step of a process for manufacturing the first example of the SAS semiconductor laser device of FIG. 1. For fabrication of the semiconductor laser device, a 0.3-$\mu$m-thick Si-doped GaAs buffer layer 2 having an impurity concentration of $1 \times 10^{18}$ cm$^{-3}$ is first grown on an n-GaAs semiconductor substrate 1 doped with Si. Thereafter, a 1.2-$\mu$m-thick Si-doped $Al_{0.80}Ga_{0.20}As$ layer 3 having an impurity concentration of $5 \times 10^{17}$ cm$^{-3}$ is grown thereon, followed by growing thereon a 0.25-$\mu$m-thick Si-doped $(Al_{0.70}Ga_{0.30})_{0.5}In_{0.5}P$ layer 4 having an impurity concentration of $5 \times 10^{17}$ cm$^{-3}$. Subsequently, a 0.05-$\mu$m-thick undoped $(Al_{0.70}Ga_{0.30})_{0.5}In_{0.5}P$ layer is grown, followed by forming thereon an active layer structure 5 having a multiple-quantum-well structure. The active layer structure 5 includes four GaInP well layers each having a thickness of 7 nm and three $(Al_{0.50}Ga_{0.50})_{0.50}In_{0.5}P$ barrier layers each having a thickness of 5 nm and sandwiched between two of the well layers.

Subsequently, a cladding layer 6 including a 0.15-$\mu$m-thick undoped $(Al_{0.70}Ga_{0.30})_{0.5}In_{0.5}P$ film and a Zn-doped p-$(Al_{0.70}Ga_{0.30})_{0.5}In_{0.5}P$ film having an impurity concentration of $5\times10^{17}$ cm$^{-3}$ is formed thereon. Further, a 0.15-$\mu$m-thick Si-doped $(Al_{0.70}Ga_{0.30})_{0.5}In_{0.5}P$ first current blocking layer 7 having an impurity concentration of $5\times10^{17}$ cm$^{-3}$ and a 0.75-$\mu$m-thick Si-doped $Al_{0.5}In_{0.5}P$ second current blocking layer 8 having an impurity concentration of $5\times10^{17}$ cm$^{-3}$ are consecutively formed thereon. Thereafter, a 0.1-$\mu$m-thick Si-doped GaAs cap layer 9 having an impurity concentration of $8\times10^{17}$ cm$^{-3}$ is formed thereon to obtain the structure of FIG. 2. The growth temperature for depositing those layers are maintained at 650° C., for example.

Figure 3:
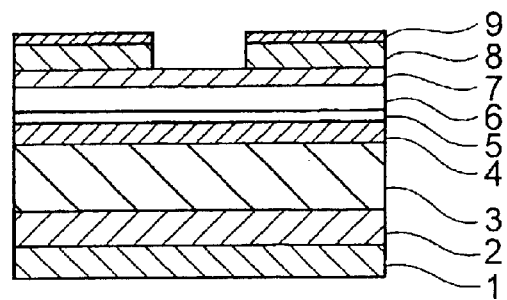
FIG. 3 is a sectional view of the vicinity of the emission facet at a step subsequent to step of FIG. 2.
Figure 4:
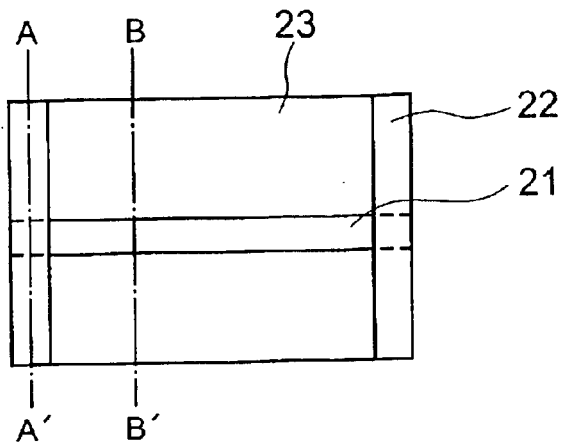
FIG. 4 is a top plan view of the vicinity of the emission facet shown in FIG. 2 at a step subsequent to step of FIG. 3.

FIGS. 3 to 7 show the steps of forming a stripe opening on the resultant wafer. A $SiO_2$ film not shown in the drawings is first formed on the GaAs cap layer 9, followed by etching thereof using a photolithographic etching process to form a $SiO_2$ mask having therein a 4-$\mu$m-wide stripe opening. Thereafter, the GaAs cap layer 9 and the second current blocking layer 8 are etched by a selective wet etching technique using the $SiO_2$ mask as an etching mask to form a stripe opening therein, as shown in FIG. 3. FIG. 4 shows the stripe opening 21 disposed between the areas of a current blocking layer 23 formed in the subsequent step.

Figure 5:
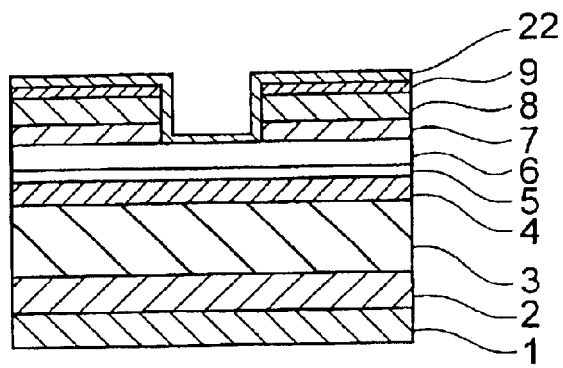
FIG. 5 is a sectional view taken along line A–A' in FIG. 4.

As shown in FIG. 2, the selective wet etching allows the second current blocking layer 8 and the cap layer 9 to be etched at a higher rate compared to the first current blocking layer 7, due to the difference in the Al content between the first current blocking layer 7 and the second current blocking layer 8. Thereafter, a pair of $SiO_2$ masks 22 are formed thereon in the vicinities of both the facets of the laser cavity for forming current non-injection areas, as shown in FIGS. 4 and 5. The first current blocking layer 7 is then selectively etched by a wet etching technique using both the $SiO_2$ masks, whereby both the current blocking layers 7 and 8 are etched in the current injection area and the second current blocking layer 8 is etched while leaving the first current blocking layer 7 unetched in the current non-injection area.

Figure 6:
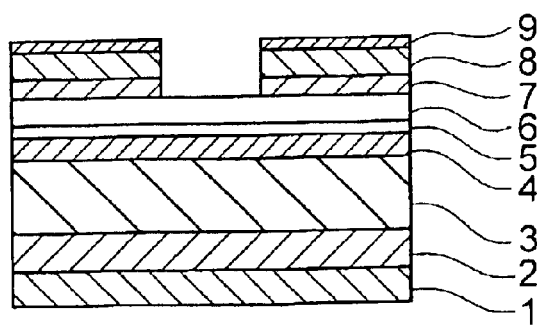
FIG. 6 is a sectional view taken along line B–B' in FIG. 4 at a step subsequent to step of FIG. 4.
Figure 7:
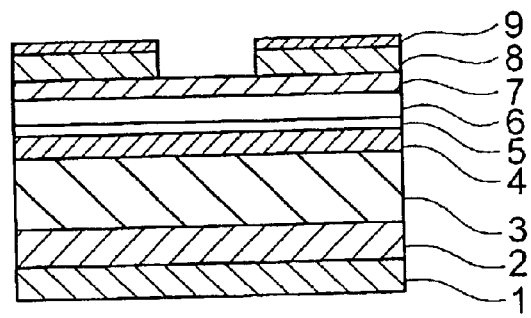
FIG. 7 is a sectional view at a step subsequent to step of FIG. 5.
Figure 8:
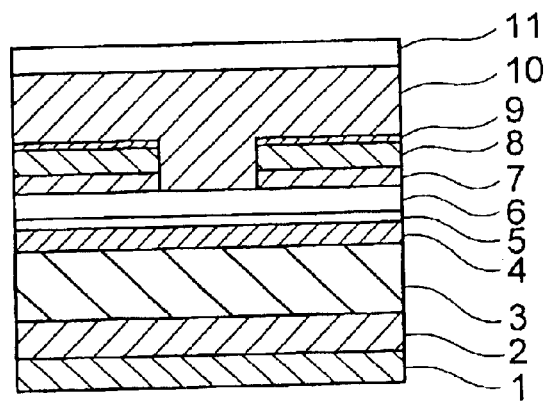
FIG. 8 is a sectional view at a step subsequent to step of FIG. 6.
Figure 9:
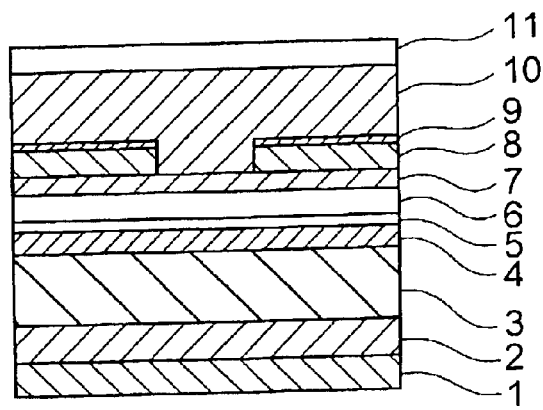
FIG. 9 is a sectional view taken along line B'—B' in FIG. 4 at a step subsequent to step of FIG. 7.
Figure 10:
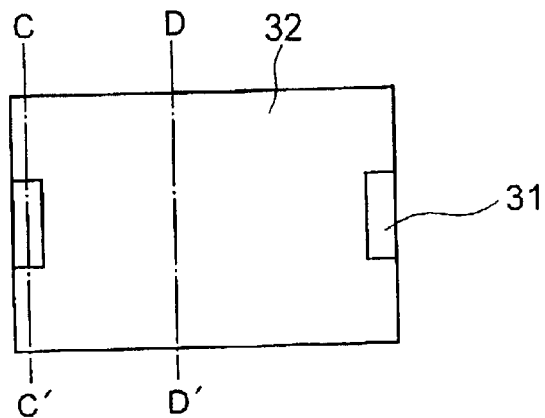
FIG. 10 is a sectional view of a semiconductor laser device according to a second example according to the embodiment of the present invention at a fabrication step thereof.

Subsequently, the $SiO_2$ mask is removed, as shown in FIGS. 6 and 7, followed by consecutively growing thereon a 1.2-$\mu$m-thick Zn-doped $Al_{0.80}Ga_{0.20}As$ external cladding layer 10 having an impurity concentration of $8\times10^{17}$ cm$^{-3}$ and a 2-$\mu$m-thick Zn-doped GaAs layer 11 having an impurity concentration of $2\times10^{18}$ cm$^{-3}$, as shown in FIGS. 8 and 9. Finally, p-side and n-side electrodes are formed on the top surface and the bottom surface, respectively, of the resultant wafer by an evaporation technique, thereby obtaining the structure of the semiconductor laser device of the present example.

The wafer is then subjected to cleavage along the direction perpendicular to the extending direction of the laser cavity. The cleavage is performed at the central area of the wafer so that the current injection area of the laser device has a length of 5 to 50 $\mu$m in the direction of the cavity after the cleavage. After the cleavage, the emission facet of each cavity is covered by an $Al_2O_3$ dielectric film and the rear facet of the each cavity is covered by an $Al_2O_3$/a-Si (amorphous silicon) multi-layer dielectric film, thereby controlling the emission facet to have a percent reflectance of 10% and the rear facet to have a percent reflectance of 90%. After covering both the facets, each semiconductor laser device is attached onto a heat sink.

It is to be noted that the first example of the semiconductor laser device thus manufactured may have a minor leakage current, which flows from the current injection area exposed from the stripe opening to the Zn-doped $(Al_{0.70}Ga_{0.30})_{0.5}In_{0.5}P$ layer 6 underlying the Si-doped $(Al_{0.70}Ga_{0.30})_{0.5}In_{0.5}P$ first current blocking layer 7 in the current non-injection area. This may cause a possibility that the semiconductor laser device is susceptible to the COD in a higher output power range of the laser device.

SECOND EXAMPLE

The second example of the semiconductor laser device solves the problem of the minor leakage current by diffusing Zn in the vicinity of each facet to obtain a mixed-crystal area in the vicinity and suppress the COD at the each facet.

Figure 11:
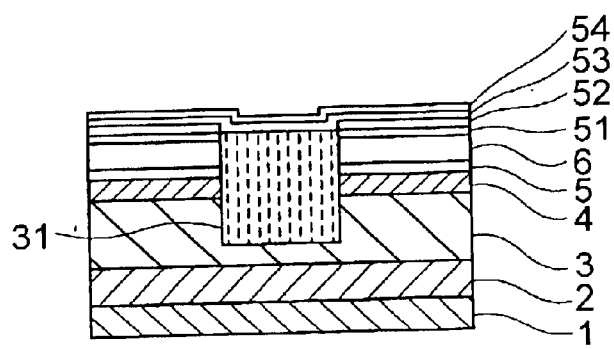
FIG. 11 is a sectional view taken along line C–C' in FIG. 10.

Referring to FIG. 11, a 0.3-$\mu$m-thick Si-doped GaAs buffer layer 2 having an impurity concentration of $1\times10^{18}$ cm$^{-3}$ is grown on a Si-doped GaAs substrate 1, followed by consecutively growing a 1.2-$\mu$m-thick Si-doped $Al_{0.80}Ga_{0.20}As$ layer 3 having an impurity concentration of $5\times10^{17}$ cm$^{-3}$ and a 0.25-$\mu$m-thick Si-doped $(Al_{0.70}Ga_{0.30})_{0.5}In_{0.5}P$ layer 4 having an impurity concentration of $5\times10^{17}$ cm$^{-3}$. Thereafter, a 0.05-$\mu$m-thick undoped $(Al_{0.70}Ga_{0.30})_{0.5}In_{0.5}P$ layer is grown, followed by growing thereon an active layer structure 5 having a multiple-quantum well structure.

The active layer structure 5 includes four 7-nm-thick GaInP well layers each having a thickness of 7 nm and three 5-nm-thick $(Al_{0.50}Ga_{0.50})_{0.5}In_{0.5}P$ barrier layers each sandwiched between two of the well layers. An upper cladding layer 6 including a 0.15-$\mu$m-thick undoped $(Al_{0.70}Ga_{0.30})_{0.5}In_{0.5}P$ film and a Zn-doped $(Al_{0.70}Ga_{0.30})_{0.5}In_{0.5}P$ film is formed on the active layer structure 5. Thereafter, a Zn-doped GaAs cap layer 51 having an impurity concentration of $5\times10^{17}$ cm$^{-3}$ is formed on the upper cladding layer 6. A silicon nitride (SiN) film 9 is then grown thereon, followed by selectively etching the same by photolithographic and wet etching techniques to form a stripe opening exposing therefrom the current non-injection area. The stripe opening has a width of 20 $\mu$m, for example. A ZnO film and a $SiO_2$ film are then deposited thereon.

Figure 12:
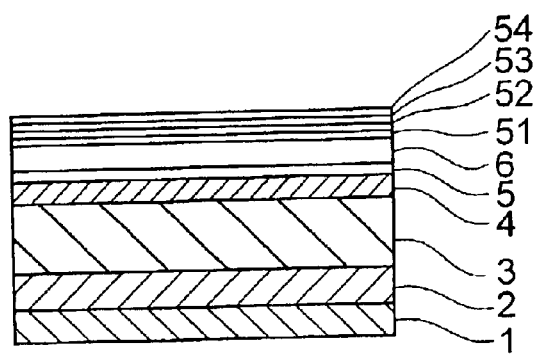
FIG. 12 is a sectional view taken along line D–D' in FIG. 10.
Figure 13:
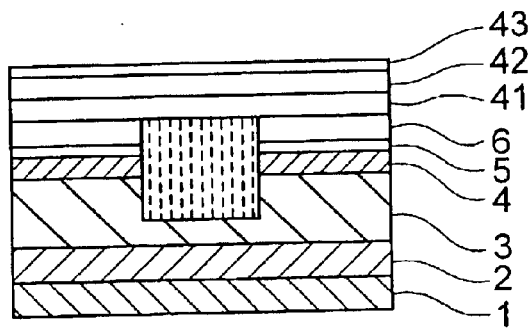
FIG. 13 is a sectional view at a step subsequent to step of FIG. 11.

Subsequently, a thermal treatment is conducted at a temperature of 550 degrees C. to thermally diffuse Zn to a desired depth, such as the depth corresponding to the internal of the Si-doped $Al_{0.80}Ga_{0.20}As$ layer 3, to obtain a mixed-crystal area 31 of the active layer structure 5 in the vicinity of the emission facet, as shown in FIGS. 11 and 12. Thereafter, the $SiO_2$ layer, ZnO layer, SiN layer and Zn-doped GaAs cap layer are etched by a wet etching, followed by growing a 0.15-$\mu$m-thick Si-doped $(Al_{0.70}Ga_{0.30})_{0.5}In_{0.5}P$ layer 41 having an impurity concentration of $5\times10^{17}$ cm$^{-3}$, and a 0.75-$\mu$m-thick Si-doped $Al_{0.5}In_{0.5}P$ layer 42 having an impurity concentration of $5\times10^{17}$ cm$^{-3}$. Further, a 0.1-$\mu$m-thick topmost Si-doped GaAs cap layer 43 having an impurity concentration of $8\times10^{17}$ cm$^{-3}$ is formed thereon, as shown in FIG. 13.

Thereafter, a $SiO_2$ film is formed on the GaAs cap layer, followed by selective etching thereof using a photolithographic technique to form a $SiO_2$ mask having therein a 4-$\mu$m-wide stripe opening. A selective etching process is then conducted to form stripe openings in the GaAs cap layer 43 and the second current blocking layer 42. This selective wet etching allows the second current blocking layer 42 to be etched at a higher rate than the first current blocking layer 41 due to the difference in the composition therebetween.

Figure 14:
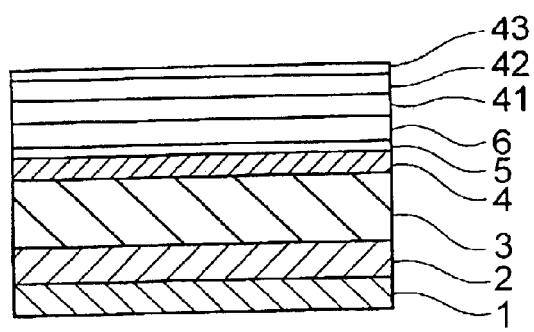
FIG. 14 is a sectional view at a step subsequent to step of FIG. 12.
Figure 15:
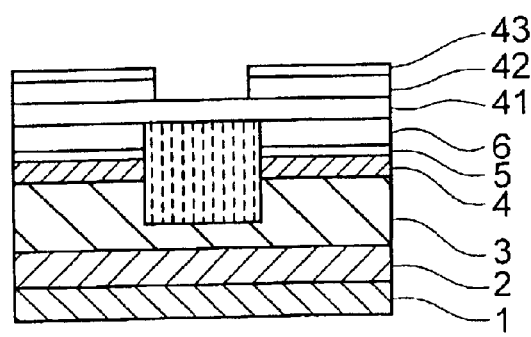
FIG. 15 is a sectional view at a step subsequent to step of FIG. 13.
Figure 16:
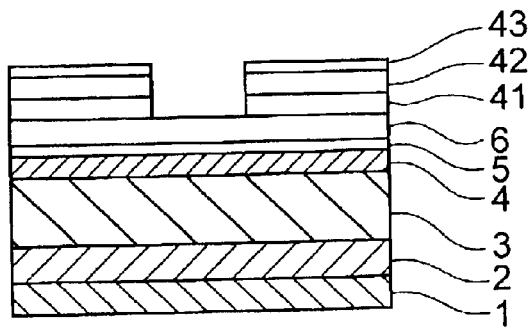
FIG. 16 is a sectional view at a step subsequent to step of FIG. 14.

Another $SiO_2$ mask is then formed for the current non-injection area. A selective wet etching is then conducted using the $SiO_2$ masks to etch the first current blocking layer 41, to thereby obtain the structure wherein the first current blocking layer 41 as well as the second current blocking layer 42 has an opening in the current injection area, and only the second current blocking layer 42 has an opening in the current non-injection area adjacent to the facet. In addition, the active layer structure has a mixed-crystal area in the vicinity of the facet due to the Zn diffusion, as shown in FIGS. 14 to 16. The width of the first current blocking layer 41 in the extending direction of the stripe is 5 to 30 $\mu$m larger than the width of the mixed-crystal area 31 formed by the Zn diffusion.

Figure 17:
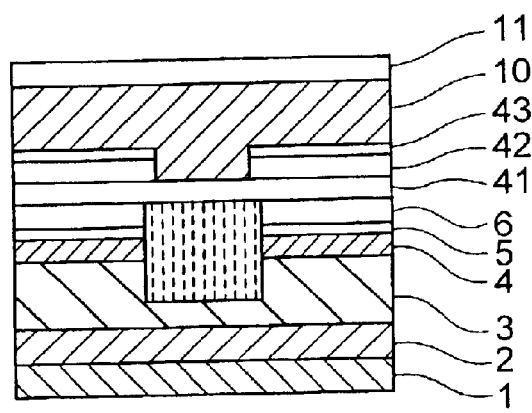
FIG. 17 is a sectional view at a step subsequent to step of FIG. 15.
Figure 18:
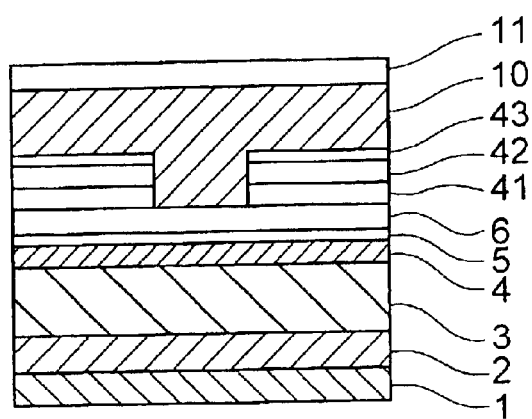
FIG. 18 is a sectional view at a step subsequent to step of FIG. 16.
Figure 19:
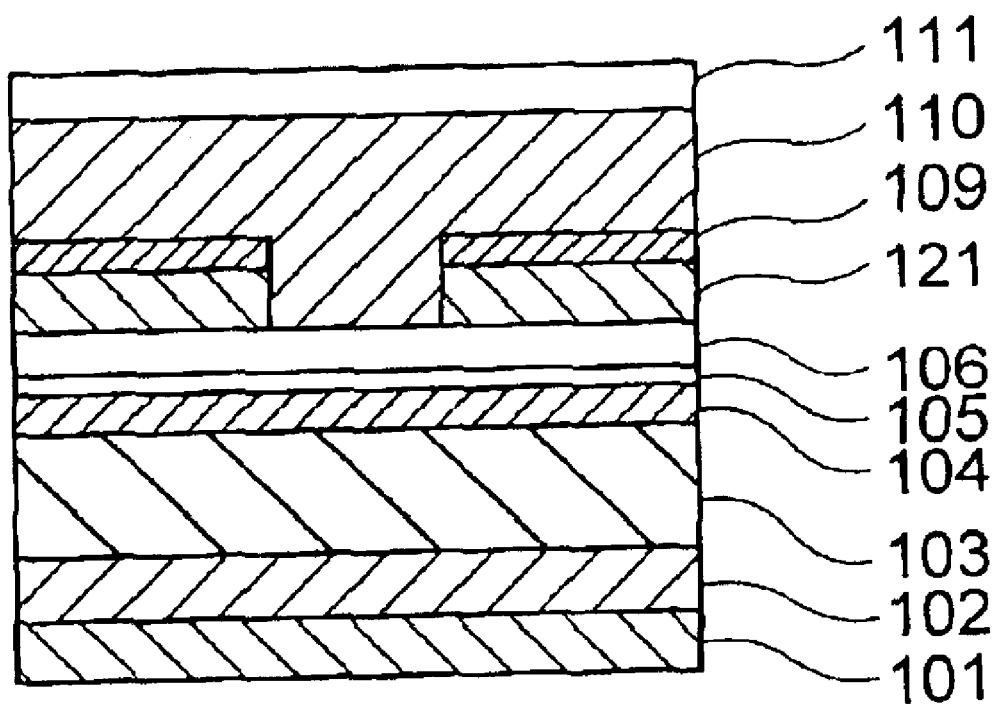
FIG. 19 is a sectional view of a conventional semiconductor laser device in the vicinity of an emission facet thereof.

After forming the opening in the second current blocking layer 42, the $SiO_2$ masks are removed, and then a 1.2-$\mu$m-thick Zn-doped $Al_{0.80}Ga_{0.20}As$ layer 10 having an impurity concentration of $8 \times 10^{17}$ cm$^{-3}$ and a 2-$\mu$m-thick Zn-doped GaAs layer 11 having an impurity concentration of $2 \times 10^{18}$ cm$^{-3}$ are consecutively formed, as shown in FIGS. 17 and 18. Thereafter, p-side and n-side electrodes are formed on the top and bottom surfaces to form a semiconductor laser wafer. The wafer is then cleaved along the direction perpendicular to the extending direction of the laser cavities. The cleavage is conducted in the central area of the wafer so that the current non-injection area of each semiconductor laser has a width of 5 to 50 $\mu$m after the cleavage.

Back to FIG. 1, there is shown a sectional structure of the emission facet of the semiconductor laser device at the fabrication step shown in FIG. 17. It is shown in FIG. 1 that the first current blocking layer 7 is left un-etched to directly contact the external cladding layer 110. The equality of the refractive indexes of the first current blocking layer 7 and the adjacent external cladding layer 110 in the current non-injection area allows the refractive index profile to be uniform within the waveguide layer to thereby suppress the mode dispersion loss.

After the cleavage, an $Al_2O_3$ dielectric film and an $Al_2O_3$/a-Si multilayer film are deposited on the emission facet and the rear facet, respectively, whereby the emission facet and the rear facet have percent reflectances of 10% and 90%, respectively. After depositing the dielectric films on both the facets, the semiconductor laser device is mounted onto a heat sink by fusion bonding to complete a SAS semiconductor laser device.

THIRD EXAMPLE

The third example of the SAS semiconductor laser device of the embodiment is similar to that of the first example except that the Si-doped $Al_{0.80}Ga_{0.20}As$ lower cladding layer 3 in the first example is replaced by a Si-doped $(Al_{0.70}Ga_{0.30})_{0.5}In_{0.5}P$ layer in the third example and that the Zn-doped $Al_{0.80}Ga_{0.20}As$ external cladding layer 10 in the first example is replaced by a Zn-doped $(Al_{0.70}Ga_{0.30})_{0.5}In_{0.5}P$ layer in the third example.

FOURTH EXAMPLE

The fourth example of the SAS semiconductor laser device of the embodiment is similar to the second example except that the Si-doped $Al_{0.80}Ga_{0.20}As$ lower cladding layer 10 in the second example is replaced by a Si-doped $(Al_{0.70}Ga_{0.30})_{0.5}In_{0.5}P$ layer in the fourth example, and that the Zn-doped $Al_{0.80}Ga_{0.20}As$ external cladding layer 11 in the second example is replaced by a Zn-doped $(Al_{0.70}Ga_{0.30})_{0.5}In_{0.5}P$ layer in the fourth example.

FIFTH EXAMPLE

The fifth example of the SAS semiconductor laser device of the present embodiment is similar to the first example except that the first current blocking layer 7 is made of $Al_{0.80}Ga_{0.20}As$, and the second current blocking layer is made of $Al_{0.90}Ga_{0.10}As$ in the fifth example.

SIXTH EXAMPLE

The sixth example of the SAS semiconductor laser device of the embodiment is similar to the second example except that the first current blocking layer 41 is made of $Al_{0.80}Ga_{0.20}As$, and the second current blocking layer 42 is made of $Al_{0.90}Ga_{0.10}As$ in the fifth example.

In each of the examples as described above, the first current blocking layer suppresses the current injection in the vicinity of the emission facet of the laser cavity, whereas the mixed-crystal area of the active layer in the vicinity of each facet does not absorb laser at the emission wavelength, to thereby suppress the COD in the vicinity of the emission facet. In addition, the structure wherein the second current blocking layer is etched in the waveguide allows an effective control on the lateral mode of the laser device. Further, the transparency of the current blocking layers to the emission wavelength allows reduction of the threshold current and the operating current of the laser device. Further, the equality of the refractive indexes of the external cladding layer and the first current blocking layer allows effective suppression of the mode dispersion loss.

Since the above embodiments are described only for examples, the present invention is not limited to the above embodiments and various modifications or alterations can be easily made therefrom by those skilled in the art without departing from the scope of the present invention.

For example, although the current non-injection areas are disposed in the vicinities of the emission facet and the rear facet of the laser cavity in the above examples, the current non-injection area may be omitted in the vicinity of the rear facet. In addition, the number of the current blocking layers may be three or more. In such a case, one of the current blocking layers having a refractive index substantially equal to the refractive index of the bottom current blocking layer and also contacting the bottom current blocking layer may be deemed as a part of the first current blocking layer in the present invention.

In addition, the active layer structure is not limited to a multiple-quantum-well (MQW) structure, and may have any active layer structure.

What is claimed is:

1. A semiconductor laser device comprising:
   a semiconductor substrate; and
   a layer structure formed thereon, comprising consecutively as viewed from the bottom:
      a lower cladding layer;
      an active layer;
      an upper cladding layer;
      first and second current blocking layers; and
      an external cladding layer, said layer structure configuring a laser cavity having an emission facet and a rear facet,
   said first and second current blocking layers having compositions different from each other, said first and second current blocking layers having aligned first openings to form a current injection area for injecting operating current into said active layer,
   said second current blocking layer having a second opening, through which said external cladding layer contacts said first current blocking layer, in a vicinity of said emission facet to form a current non-injection area for blocking said operating current, and said external cladding layer having a refractive index substantially equal to a refractive index of said first current blocking layer.

2. The semiconductor laser device according to claim 1, wherein said active layer comprises a mixed-crystal area in a vicinity of each of said emission facet and rear facet, said mixed-crystal area comprising Zn diffused from said upper cladding layer.

3. The semiconductor laser device according to claim 1, wherein said semiconductor substrate comprises a GaAs substrate, said first and second current blocking layers comprise $Al_xGa_{1-x}InP$, and an Al content of said first current blocking layer is lower than an Al content of said second current blocking layer.

4. The semiconductor laser device according to claim 1, wherein said semiconductor substrate comprises a GaAs substrate, said first and second current blocking layers comprise $Al_xGa_{1-x}As$, and an Al content of said first current blocking layer is lower than an Al content of said second current blocking layer.

5. The semiconductor laser device according to claim 1, wherein said layer structure comprises an AlGaInP-group material.

6. The semiconductor laser device according to claim 1, wherein at least one of said first and second current blocking layers comprises a multilayer structure.

7. A semiconductor laser device comprising:

a semiconductor substrate; and a multi-layer structure formed on a first surface of said semiconductor substrate, said multi-layer structure comprising:
  a first current blocking layer;
  a second current blocking layer; and
  an external cladding layer;

wherein said first current blocking layer and said second current blocking layer include aligned first openings to form a current injection area for injecting an operating current into an active layer;

wherein second current blocking layer includes a second opening through which said external cladding layer contacts said first current blocking layer in a vicinity of said emission facet to form a current non-injection area for blocking said operating current, said external cladding layer having a refractive index substantially equal to a refractive index of said first current blocking layer to suppress mode dispersion loss.

8. The semiconductor laser device according to claim 7, wherein said multi-layer structure further comprises:

a buffer layer disposed on said first surface of said semiconductor substrate;

a first lower cladding layer disposed above said buffer layer;

a second lower cladding layer disposed above said first lower cladding layer;

said active layer disposed above said second lower cladding layer; and an upper cladding layer disposed above said active layer;

wherein said external cladding layer is disposed above said upper cladding layer;

wherein said first current blocking layer and said second current blocking layer are disposed between said upper cladding upper cladding layer and said external cladding layer, said second current blocking layer being disposed above said first current blocking layer, and wherein said multi-layer structure configures a laser cavity having an emission facet and a rear facet.

9. The semiconductor laser device according to claim 8, wherein said active layer comprises:

a mixed-crystal area in a vicinity of each of said emission facet and rear facet, said mixed-crystal area comprising Zn diffused from said upper cladding layer.

10. The semiconductor laser device according to claim 7, wherein said multi-layer structure comprises an AlGaInP-group material.

11. The semiconductor laser device according to claim 7, wherein at least one of said first and second current blocking layer comprises a multi-layer structure.

12. The semiconductor laser device according to claim 8, wherein said active layer comprises:

a multi-layer member having at least one well layer and at least one barrier layer.

13. The semiconductor laser device according to claim 12, wherein said multi-layer member comprises:

four active portions; and three barrier layers disposed between said active portions.

14. The semiconductor laser device according to claim 12, wherein said at least one well layer comprises GaInP and said at least one barrier layer comprises $Al_xGa_{1-x}InP$.

15. The semiconductor laser device according to claim 8, further comprising:

an $Al_2O_3$ dielectric film deposited on said emission facet; and an $Al_2O_3$/a-Si multi-layer film deposited on said rear facet.

16. The semiconductor laser device according to claim 7, wherein said first current blocking layer has an aluminum content that is lower than an aluminum content of said second current blocking layer.

17. The semiconductor laser device according to claim 7, wherein said first current blocking layer and said second current blocking layer comprise one of $Al_xGa_{1-x}InP$ and $Al_xGa_{1-x}As$.

18. The semiconductor laser device according to claim 17, wherein said first current blocking layer comprises $Al_xGa_{1-x}As$ and said second current blocking layer comprises $Al_xGa_{1-x}As$;

wherein said first current blocking layer comprises an aluminum content that is lower than an aluminum content of said second current blocking layer.

19. The semiconductor laser device according to claim 17, wherein said first current blocking layer comprises $Al_xGa_{1-x}InP$ and said second current blocking layer comprises $Al_xGa_{1-x}InP$, and wherein said first current blocking layer comprises an aluminum content that is lower than an aluminum content of said second current blocking layer.

20. The semiconductor laser device according to claim 7, wherein said first current blocking layer comprises $Al_xGa_{1-x}InP$ and said second current blocking layer comprises $Al_xIn_{1-x}P$, and wherein said first current blocking layer comprises an aluminum content that is lower than an aluminum content of said second current blocking layer.

21. The semiconductor laser device according to claim 7, wherein said semiconductor substrate comprises a GaAs substrate.

22. The semiconductor laser device according to claim 8, wherein said multi-layer structure further comprises:

an internal cap layer disposed above said upper cladding layer.

23. The semiconductor laser device according to claim 8, wherein said multi-layer structure further comprises:

an external cap layer disposed above said external cladding layer.

* * * * *